United States Patent [19]

D'Amato

[11] Patent Number: 5,000,388
[45] Date of Patent: Mar. 19, 1991

[54] SPRAY MANIFOLDS

[75] Inventor: Mark D'Amato, Quebec, Canada

[73] Assignee: D.E.M. Controls of Canada, Montreal, Canada

[21] Appl. No.: 385,354

[22] Filed: Jul. 27, 1989

[51] Int. Cl.⁵ .............................................. B05B 1/14
[52] U.S. Cl. ................................. 239/550; 239/553.3; 239/560
[58] Field of Search ............... 239/550, 553, 556, 557, 239/560, 565, 567, 568, 553.3; 118/315

[56] References Cited

U.S. PATENT DOCUMENTS

| | | | |
|---|---|---|---|
| 1,177,884 | 4/1916 | Molesta et al. | 239/550 |
| 1,208,706 | 12/1916 | Hatfield | 239/565 |
| 1,461,034 | 7/1923 | Frisbie | 239/567 |
| 1,590,195 | 6/1926 | Kerr | 239/565 |
| 1,632,370 | 6/1927 | Cruncleton et al. | 239/565 |
| 2,900,992 | 8/1959 | Johnson | 239/556 |
| 2,940,466 | 6/1960 | Speights | 239/208 |
| 3,423,029 | 1/1969 | Demaison | 239/565 |
| 3,831,681 | 8/1974 | Livingston | 239/209 |
| 4,349,073 | 9/1982 | Zublin | 239/550 |
| 4,706,889 | 11/1987 | Hofmann | 239/550 |

FOREIGN PATENT DOCUMENTS 521106  7/1953  Belgium .............................. 239/565

OTHER PUBLICATIONS

Industrial Catalog 27, Spraying Systems Co., pp. 1–86, 1978.
Catalog, Albuz, Les Buses de Pulverisation Agricole De A a Z.

Primary Examiner—Andres Kashnikow
Assistant Examiner—Michael J. Forman
Attorney, Agent, or Firm—Stetina and Brunda

[57] ABSTRACT

A spray manifold for spraying liquid chemicals, suspension and solutions upon workpieces such as printed circuit boards. The spray manifold comprises a tubular pheriphery with a plurality of tubular inner members disposed therein and fluidly connected thereto. Spray nozzles mounted at various points on the manifold provide for emanation at a desired spray pattern from the manifold. The configuration and interconnection of the various tubular components of the manifold is specifically arranged and designed to prevent turbulence of fluid flowing therewithin and to promote even and continuous fluid pressure throughout the manifold.

14 Claims, 3 Drawing Sheets

SPRAY MANIFOLDS

BACKGROUND OF THE INVENTION

The present invention relates generally to the field of chemical process technology and more particularly to spray manifolds for spraying liquid chemicals, solutions and/or suspensions upon surfaces of printed circuit boards and/or similar work-pieces.

During the manufacture of printed circuit boards, various chemical solutions and/or suspensions are routinely applied to surfaces of the circuit boards. Examples of liquid chemicals, solutions and/or suspensions routinely applied to the surface of printed circuit boards include, but are not limited to; cleaners, etchants, plating solutions, strippers, photographic developing solutions, abrasive pumice slurries and rinse water.

Many of the liquid chemicals, solutions and/or suspensions used in the manufacture and preparation of printed circuit boards may be effectively applied to the surfaces of the circuit boards by way of automated or semi-automated spray process machinery. Typical spray process machines used in such applications generally comprise one or more mechanical conveyors having numerous sprayer heads or nozzles positioned thereabove and/or therebelow for applying the desired chemicals, solutions and/or suspensions to circuit boards as they move along the conveyor(s). The exposure time and amount of each chemical applied to each circuit board is generally determined by a) the density of the spray, b) the regions(s) of the conveyor(s) covered by the spray and c) the speed at which the circuit boards pass through the spray-covered region(s) of the conveyor Additionally, in some applications it is desirable that the liquid chemicals, solutions and/or suspensions be sprayed at specific angles relative to surfaces of the circuit board so as to effect desirable patterns of flow (e.g. laminar flow) of the applied liquids, solutions and/or suspensions upon the surfaces of the circuit boards.

Although many types of spray process machines are available for use in circuit board manufacturing applications, many of the component parts (e.g., spray manifolds, conveyors, etc.) used in the construction of such prior art devices are not specifically designed for circuit board applications. Accordingly, there exists a need in the art for improved chemical spray machinery for use in circuit board manufacturing and similar applications.

SUMMARY OF THE INVENTION

The present invention comprises spray manifolds for spraying liquid chemicals, solutions and/or suspensions on workpieces such as printed circuit boards and the like.

In accordance with the invention there is provided a spray manifold comprising a generally rectangular tubular periphery and a plurality of tubular inner members disposed within and fluidly connected to said tubular periphery.

The generally rectangular tubular periphery of the manifold comprises first, second and third elongate tubular members, joined in end to end fashion so as to form three sides of the generally rectangular tubular periphery. A fourth tubular member is bent or angled in configuration. The first end of the fourth tubular member is connected to the second end of the tubular member such that the initial portion of the fourth tubular member extends generally perpendicular to the third tubular member. The remainder of the fourth tubular member turns inwardly so that the second end of the fourth tubular member merges with, and is fluidly connected to, the first tubular member at a point between the longitudinal ends thereof. The angle of entry of the fourth tubular member into the first tubular member is such that fluid flowing from the fourth tubular member into the first tubular member will merge, join or fuse with fluid flowing into the input end of the first tubular member from a separate fluid supply source. Thus, any recirculating fluid and any newly entering fluid will combine with a minimum of turbulence, cavitation or disruption.

It is preferable that the spray manifolds of the present invention be substantially formed of plastic pipe or similar chemical/resistant tubular stock.

Additionally, it is preferable that the spray nozzles mounted on the spray manifolds of the present invention be resistant to abrasion, so as to be useful in the spraying of abrasive chemicals, slurries and the like. Towards such end, the preferred spray nozzles may comprise tubular outer bodies made of plastic (e.g. polypropylene) with an inner sleeve or insert formed therein The inner sleeve or insert is generally formed of chemical resistant, nonabrasive material (e.g. ceramic).

Further objects and advantages of the invention will become apparent to those skilled in the art upon reading and understanding of the following detailed description and the accompanying drawings.

DETAILED DESCRIPTION OF A PREFERRED EMBODIMENT

The following detailed description and the accompanying drawings are provided for purposes of illustrating a presently preferred embodiment of the invention and are not intended to limit the scope of the invention in any way.

The spray manifolds 10, 10a, 12, 12a, 14, 14a, 16, 16a comprise generally rectangular outer peripheries formed of fluidly connected individual pipe members with a plurality of inner pipe members or "spray bars" traversing therewithin.

Figure 1:
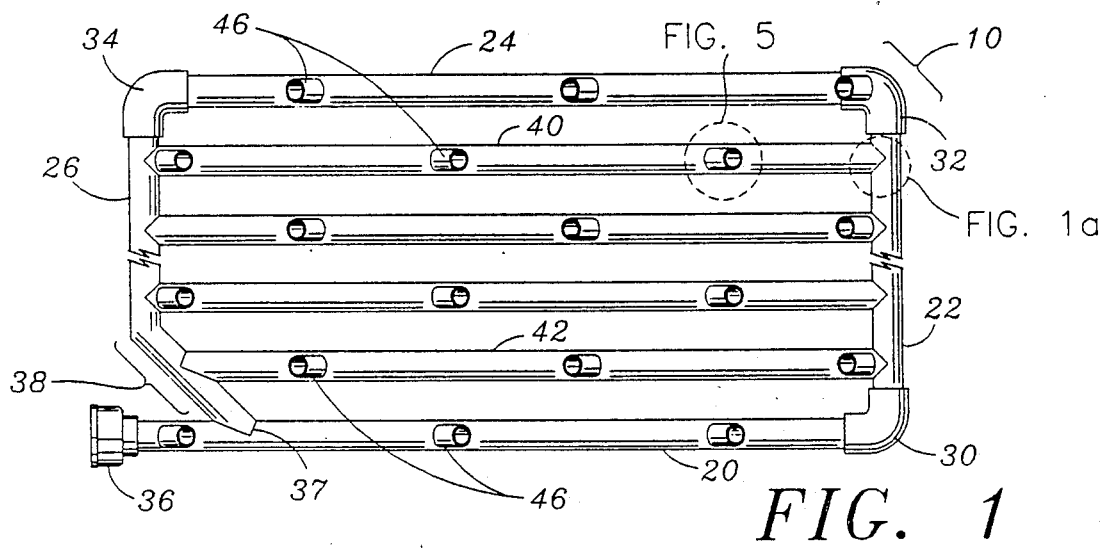
FIG. 1 is a plan view of a spray manifold of the present invention having a plurality of nozzle mounting nipples arranged in a first pattern thereon.
Figure 3:
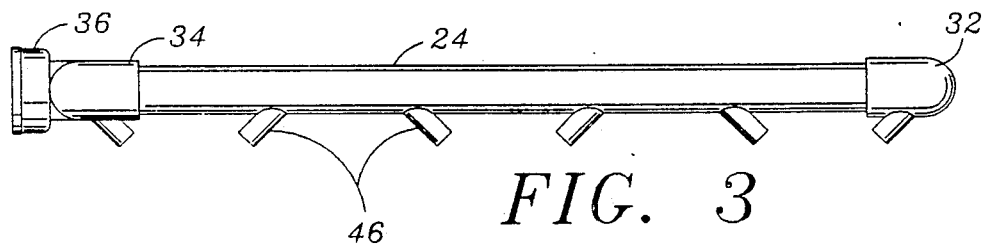
FIG. 3 is an elevational view of the spray manifold of FIG. 1.
Figure 2:
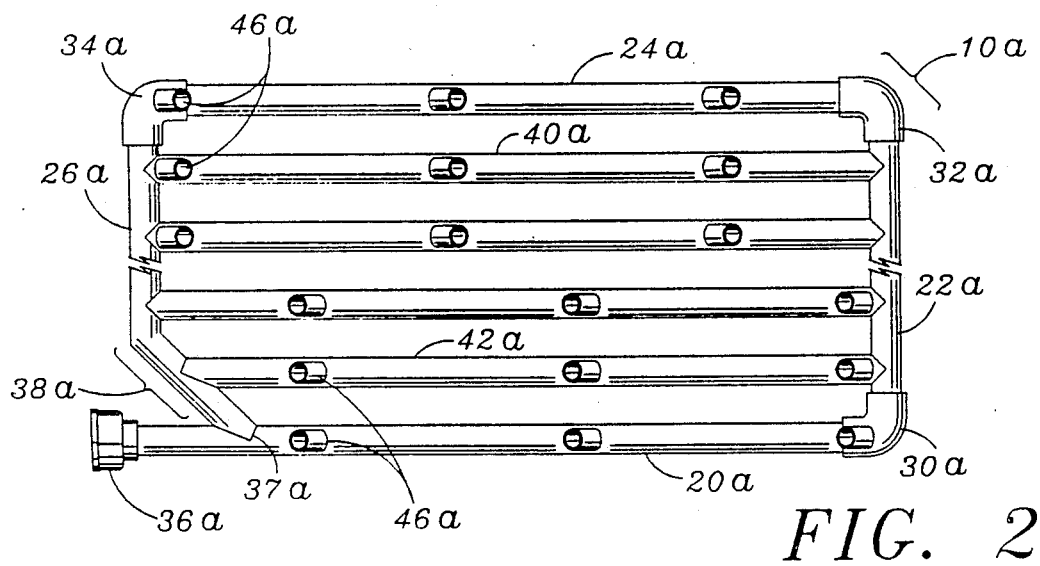
FIG. 2 is a plan view of a spray manifold of the present invention having a plurality of nozzle mounting nipples arranged in a second pattern thereon.

For example, FIGS. 1-2 show generic spray manifolds of the present invention and serve to depict the manner in which the spray manifolds of the invention are constructed. Referring to FIGS. 1-2, each manifold of the present invention comprises a peripheral flow path comprising first 20, 20a, second 22, 22a, third 24, 24a and fourth 26, 26a pipe members. A plurality of inner pipe members 40, 40a, 42, 42a are fluidly connected to and traverse between the second pipe member 22, 22a and fourth pipe member 26, 26a.

The first 20, 20a, second 22, 22a, and third 24, 24a peripheral pipe members are substantially straight segments of pipe and are fluidly connected one to another, by way of elbows 30, 30a, 32, 32a.

The fourth peripheral pipe member 26, 26a is bent or angled configuration. The first end of the fourth peripheral pipe member 26, 26a is connected to the second end of the third pipe member 24, 24a by way of elbow 34, 34a. The fourth pipe member 26, 26a is inwardly bent or angled. The bent or angled portion 38, 38a of a fourth pipe member 26, 26a extends inwardly such that the second end of the fourth pipe member 26, 26a meets first pipe member 20, 20a at a point between the longitudinal ends thereof. An aperture or hole extends through the outer wall of the first pipe member 20, 20a at the point where the second end of the fourth pipe member 26, 26a meets therewith. The second end of the fourth 25 pipe member is cut radially on an angle as shown. The radially cut second end of the first pipe member is positionable over the cylindrical outer surface of the first pipe member around the aperture or hole formed therein. Adhesive or bonding material is applied to form a water tight seal between the second end of the fourth pipe member 26, 26a and the side wall of the first pipe member 20, 20a.

By such arrangement the fourth pipe member 26, 26a is fluidly connected to the first pipe member 20, 20a. The aperture formed in the wall of the first pipe member is approximately the same size and shape as the inner bore of the fourth pipe member 26, 26a. Thus, fluid may pass through the fourth pipe member - first pipe member joint 37, 37a with little or no turbulence or disruption.

Additionally, the acute angular entry of the fourth pipe member 26, 26a into the first pipe member 20, 20a facilitates smooth, nonturbulent fusion or joinder of fluid flowing from the fourth member 26, 26a into the first member 20, 20a through coupling 36, 36a. Such nonturbulent fusion or joinder of a) the recirculating fluid with b) the newly infused fluid, ensures even and continuous fluid pressure within the manifold and avoids cavitation, flow alternation, or other flow disruptions that would likely occur if such acute angular entry were not employed.

The plurality of inner transverse pipe members 40, 40a, 42, 42a are fluidly connected to and extend between second pipe member 22, 22a and fourth pipe member 26, 26a. Such transverse pipe member 40, 40a, 42, 42a complete the tubular network of the manifold.

Figure 1A:
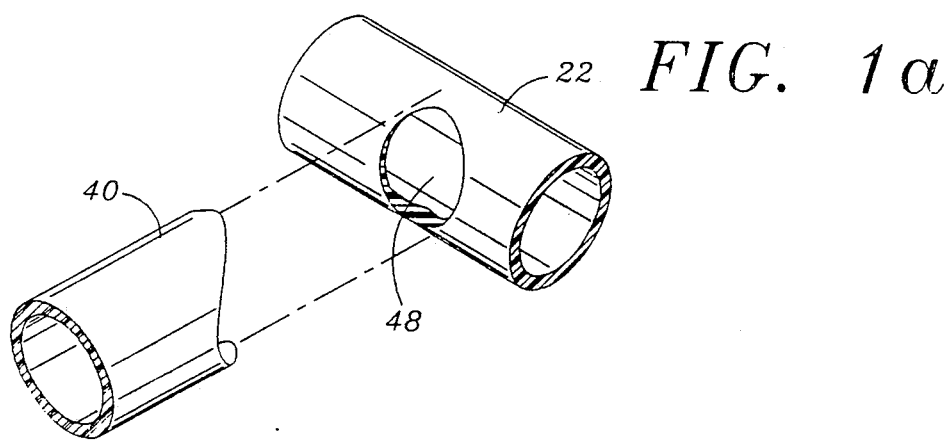
FIG. 1a is an exploded view of a portion of the spray manifold of FIG. 1 showing the manner in which the transverse pipe members are joined to the tubular periphery.

Each inner pipe member 40, 40a, 42, 42a comprises a section of pipe (e.g. PVC pipe) which is fluidly connected at either end to second pipe member 22 or first pipe member 26. The manner in which the transverse pipe members 40, 42 are connected to the side pipes 22, 22a, 26, 26a is shown in the exploded view of FIG. 1a. Specifically, the ends of the transverse pipe members 40 are cut radially as shown, so that the radially cut end of the pipe member 40 is positionable and affixable over the cylindrical outer surface of the side pipe 22. A hole 48 is cut in the wall of side pipe 22. Hole 48 is sized and configured approximately the same as the inner bore of the transverse pipe member 40. Thus, when the radially cut end of transverse pipe member 40 is positioned over the hole 48 of side pipe member 22, fluid may flow from the side pipe member 22 into the inner pipe member 40 with a minimum of turbulence or disruption. An adhesive or other bonding material is applied to form a fluid tight union between the end of transverse inner pipe member 40 and the side pipe 22. Such means of connecting the transverse pipe members to the tubular periphery of the manifold provides for even, non-disrupted flow of fluid therebetween and therethrough.

Figure 4:
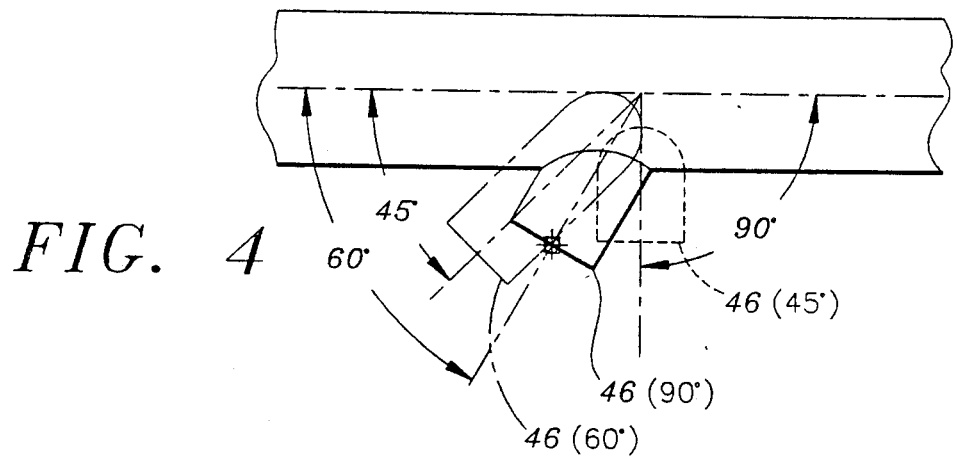
FIG. 4 is an enlarged sectional view of a segment 4-5 of FIG. 1 including added illustrations of three (3) possible angular orientations of the nozzle mounting nipples attached thereto.

A plurality of nozzle mounting nipples 46, 46a are positioned on each spray manifold. Such nozzle mounting nipples 46, 46a comprise short (e.g. less than one inch in length) segments of tubing or pipe (e.g. PVC pipe). The nipples 46, 46a are mounted on and extend from the walls of pipe members 20, 20a, 24, 24a, 40, 40a, 42, 42a. Each individual nozzle mounting nipple 46, 46a may be connected to the pipe members 20, 20a, 24, 24a, 40, 40a, 42, 42a at any angle necessary to facilitate the desired pattern and/or overlap of the individual sprays emanating therefrom. As shown in FIG. 4, the nipples 46, 46a are routinely mounted on the manifold so as to be oriented at 45, 60 or 90 degrees relative to the major axis of the pipe member to which the nipple is attached. For example, in the manifold shown in FIG. 1, nipple 46 are aimed at approximate 45° angles in alternating directions while in the embodiment shown in FIG. 2, the nipples 46a are aimed at approximate 45° angles, with adjacent nipples 46a being directed in a common direction.

Figure 5:
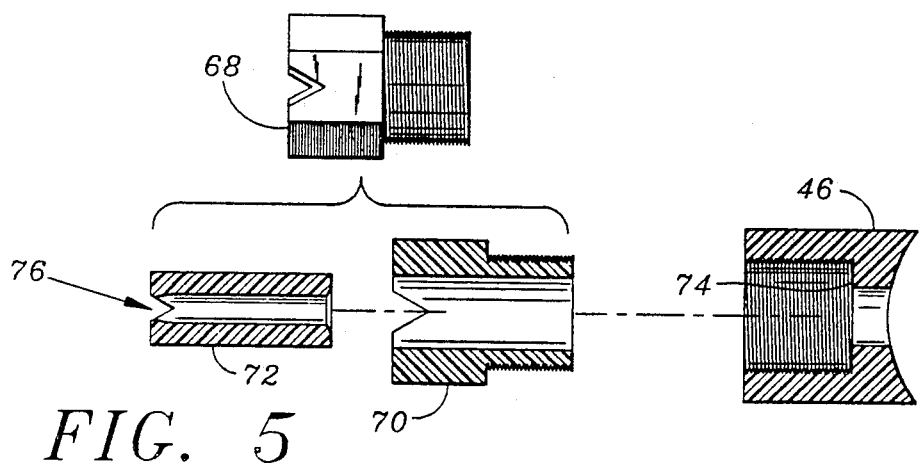
FIG. 5 is an exploded view of segment 4-5 of FIG. 1 including an exploded representation of a preferred spray nozzle mountable thereon.

Each nozzle mounting nipples 46, 46a are sized and configured to receive and hold a spray nozzle therein. A preferred type of spray nozzle for use in accordance with the present invention is shown in FIG. 5. Such nozzle comprises an outer body 70 made of plastic (e.g. polypropolyene) and an inner body or core insert 72 made of ceramic material (e.g. ceramic alumina). The core insert 72 is positioned within the polypropolyene outer body 70. The polypropylene outer body is partially threaded on the exterior of its base while the nipple is at least partially internally threaded so as to permit the polypropylene outer body of the nozzle to be rotatably advanceable into the internally threaded nipple 46. It is preferred that only the distal portion of the inner bore 71 of the nipple be threaded so that an annular shoulder is formed at the base of the threaded portion, thereby providing a surface against which the nozzle may abut when screwed fully into the nipple. Preferably, the width of the shoulder 74 is approximately equal to the wall thickness of the nozzle 70 so that the inner bore of the nipple 46 is approximately the same size of the inner bore of the nozzle 70. Because the inner bore of the nipple 46 and the inner bore of the nozzle 70 are approximately the same size, fluid is able to flow directly therethrough without unnecessary disruption or changes in pressure as would be caused by different sizing of the nipple 42 and nozzle 70 bores.

The core 72 of each nozzle 70 comprises a somewhat conical member having a hollow inner bore terminating in an aperture 76 at the distal end thereof. The size and configuration of the inner bore of the nozzle body 70, core 72 and aperture 76 will determine the volume and spray pattern of spray emanating from the nozzle 68.

A preferred polypropylene/ceramic alumina nozzle assembly 68 for use in accordance with the invention is available commercially from Albuz, Ceramiques Techniques Desmarquest, Evreux, France.

Figure 6:
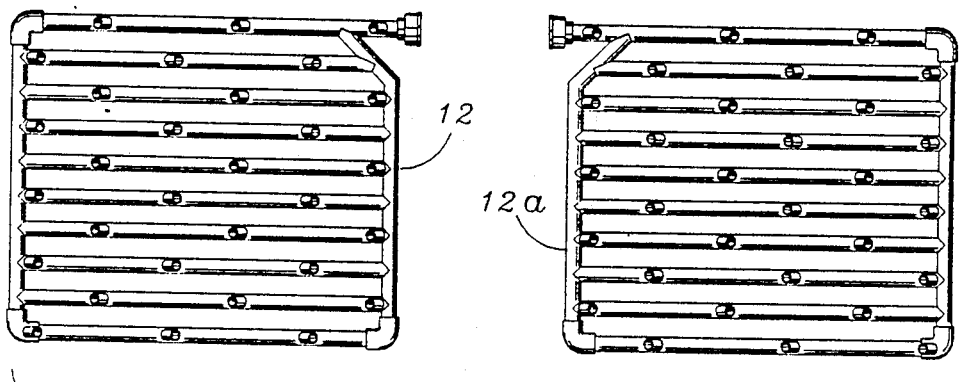
FIGS. 6-8 show several different sized manifolds, all of which embody the present invention.
Figure 7:
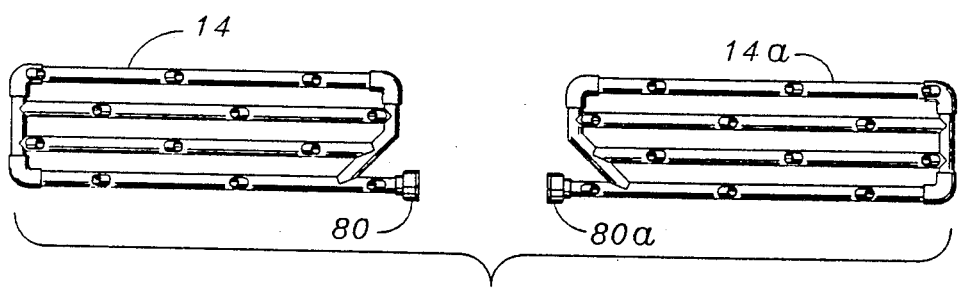
Figure 8:
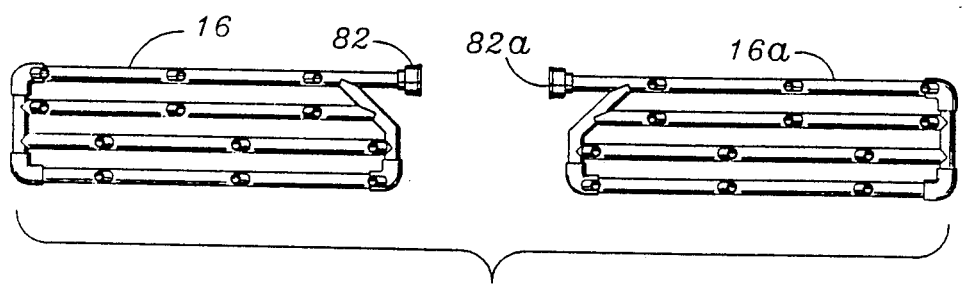

FIGS. 6–8 show several different size manifolds, all of which embody the present invention. Specifically, FIG. 6 shows manifolds 12, 12a having a generally rectangular tubular periphery with eight (8) inner pipe members positioned transversely therewithin. Manifold 12 is fitted for right hand connection while manifold 12a is fitted for left hand connection. Thus, manifolds 12 and 12a are essentially mirror images of one another. The nozzle pattern shown on manifolds 12 and 12a is staggered. However, it will be appreciated that any nozzle pattern may be employed depending on the intended application and desired spray pattern.

FIG. 7 shows spray manifolds 14 and 14a which comprise generally rectangular outer periphery with two (2) inner pipe members positioned transversely therewithin. The manifolds 14 and 14a are fitted for right and left hand connection respectively and are therefore mirror images of one another. The nozzle pattern shown on the manifolds 14, 14a is staggered. However, it will be appreciated that any nozzle pattern may be employed depending upon the desired application and spray pattern. The nozzles 14, 14a are provided with longer, extended couplings 80, 80a which extend outwardly from each manifold 14, 14a.

FIG. 8 shows manifolds 16, 16a, each comprising a generally rectangular outer periphery with two (2) transverse pipe members positioned therein. The manifolds 16, 16a differ from manifolds 14, 14a only in that they incorporate non-extended connectors 82, 82a instread of the longer, extended connectors 80, 80a shown on manifolds 14, 14a.

Although the invention has been described herein with particular reference to presently preferred embodiments thereof, it will be appreciated that many modifications, additions and deletions may be made to such preferred embodiments without departing from the spirit and scope of the invention. For example, many patterns and positioning of the nozzles may be employed to effect any desired spray pattern. Furthermore, the manifolds may be adapted for right or left hand feed depending on the type of machinery in which the manifold is to be placed. Accordingly, it is intended that these and other modifications, alterations and additions be included within the scope of the following claims and the equivalents thereof.

What is claimed is:

1. A spray manifold for spraying liquid chemicals or planar work pieces such as printed circuit boards passing adjacent the manifold said manifold comprising:
   a generally rectangular, tubular periphery comprising first, second and third generally straight tubular members fluidly connected in end to end fashion to form three sides of said generally rectangular periphery and a fourth non-straight tubular member having an angular bend formed therein, each of said first, second, third and fourth tubular members having first and second ends;
   the first end of said first tubular member being connectable to a pressurized liquid supply source;
   the second end of said fourth tubular member being connected to said first tubular member such that circulating liquid flowing from said fourth tubular member will enter said first tubular member at an acute angle relative to liquid entering the first end of said first tubular member from said liquid supply source so as to join therewith in a manner facilitating reduced turbulence to maintain even liquid pressure within the manifold and thereby discharge an even coating of liquid upon a surface of the adjacent work piece;
   a plurality of inner tubular members fluidly connected to said tubular periphery and extending therewithin; and
   a plurality of spray nozzles mounted on at least some of said inner tubular members said spray nozzles being arrayed about said tubular periphery and said inner tubular members to spray liquid chemicals upon the surface of a work piece passing adjacent the manifold.

2. The spray manifold of claim 1 wherein said generally rectangular tubular periphery comprises:
   the second end of said first tubular member being fluidly connected to the first end of said second tubular member such that said second tubular member extends generally perpendicular to said first tubular member;
   the second end of said second tubular member being fluidly connected to the first end of said third tubular member such that said third tubular member extends generally perpendicular to said second tubular member;
   the second end of said third tubular member being fluidly connected to the first end of said angular fourth tubular member; and
   the second end of said angular fourth tubular member being fluidly connected to said first tubular member at a point between the first and second ends thereof.

3. The spray manifold of claim 2 wherein curved elbow members are used to connect said first, second and third tubular members in forming said three sides of said generally rectangular periphery.

4. The spray manifold of claim 1 wherein said inner tubular members comprises sections of pipe having opposing longitudinal ends, the opposing longitudinal ends of said pipe sections being fluidly connected to said tubular periphery in such manner as to permit flow of pressurized liquid from the tubular periphery into each of said inner tubular members.

5. The spray manifold of claim 1 wherein said inner tubular members comprises straight sections of pipe arranged generally parallel to one another and positioned within said rectangular periphery so as to be in parallel relation to said first and third tubular members.

6. The spray manifold of claim 1 wherein a plurality of apertures are formed in said tubular periphery and further wherein said inner tubular members comprise sections of pie having first and second ends, said first and second ends being radially cut so as to be positionable against the outer surface of said tubular periphery such that each of said apertures will open into one of said inner tubular members, thereby facilitating flow of liquid from the tubular periphery into each of the inner tubular members.

7. The spray manifold of claim 1 wherein said plurality of nozzles are mounted individually at points on said inner tubular members.

8. The spray manifold of claim 1 wherein said spray nozzles are mounted upon said manifold by way of nozzle attachment nipples.

9. The spray manifold of claim 8 wherein each said nozzle attachment nipple comprises a segment of plastic tubing, said segment of plastic tubing being smaller in diameter than the tubular member of the manifold upon which it is mounted.

10. The spray manifold of claim 8 wherein a distal portion of the inner bore of said nipple is enlarged and threaded so that a nozzle may be screwed thereinto and further such that the non-enlarged portion of the inner bore thereof is sized and configured substantially the same as the inner bore of the nozzle, thereby facilitating passage of liquid from said nipple into said nozzle with a minimum of turbulence and disruption thereof.

11. The spray manifold of claim 1 wherein the inner tubular periphery, tubular members and spray nozzles are formed to be non-degradable when contacted by caustic chemical solutions used in the production of printed circuit boards.

12. The spray manifold of claim 11 wherein said tubular periphery and said inner tubular members are formed of plastic pipe.

13. The spray manifold of claim 11 wherein each of said nozzles comprises the plastic outer body having an inner core formed of abrasion resistant material.

14. The spray manifold of claim 13 wherein said at least one spray nozzle comprises a polypropylene outer body having a ceramic core positioned therein.

* * * * *

UNITED STATES PATENT AND TRADEMARK OFFICE
CERTIFICATE OF CORRECTION

PATENT NO. : 5,000,388
DATED : March 19, 1991
INVENTOR(S) : Mark D'Amato

It is certified that error appears in the above—identified patent and that said Letters Patent is hereby corrected as shown below:

At column 1, line 34, after "conveyor" insert --.--.

At column 2, line 45, delete "a".

At column 5, line 49, delete "or" and insert therefore --on--.

At column 6, line 46, delete "comprises" and insert therefore --comprise--.

At column 6, line 53, delete "pie" and insert therefore --pipe--.

Signed and Sealed this

Fifteenth Day of September, 1992

Attest:

DOUGLAS B. COMER

*Attesting Officer*       *Acting Commissioner of Patents and Trademarks*